United States Patent
Nordlander

[19]

[11] Patent Number: 5,858,456
[45] Date of Patent: Jan. 12, 1999

[54] METHOD FOR METAL COATING DISCRETE OBJECTS BY VAPOR DEPOSITION

[75] Inventor: Johan Nordlander, Linköping, Sweden

[73] Assignee: Applied Vacuum Technologies 1 AB, Linkoping, Sweden

[21] Appl. No.: 499,637

[22] Filed: Jul. 7, 1995

Related U.S. Application Data

[63] Continuation of Ser. No. 94,098, filed as PCT/SE92/00070 Feb. 6, 1992 published as WO92/13980 Aug. 20, 1992, abandoned.

[30] Foreign Application Priority Data

Feb. 6, 1991 [SE] Sweden .................................. 9100372

[51] Int. Cl.$^6$ .............................. C23C 16/00; B05D 3/00
[52] U.S. Cl. .......................... 427/132; 427/250; 427/294; 427/561
[58] Field of Search ..................................... 427/132, 250, 427/251, 166, 294, 296, 591, 593, 561, 566; 118/727, 726, 723 EB, 723 VE, 723 FE

[56] References Cited

U.S. PATENT DOCUMENTS

| | | | |
|---|---|---|---|
| 3,390,249 | 6/1968 | Hanks | 118/726 |
| 3,516,860 | 6/1970 | Simmons | 427/132 |
| 3,525,638 | 8/1970 | Archey | 427/132 |
| 3,526,206 | 9/1970 | Jones | 118/726 |
| 3,793,179 | 2/1974 | Sablev et al. | 204/298 |
| 3,803,707 | 4/1974 | Passmore et al. | 29/611 |
| 3,874,798 | 4/1975 | Antonsson et al. | 356/159 |
| 4,399,013 | 8/1983 | Sugita et al. | 427/132 |
| 4,748,315 | 5/1988 | Takahashi et al. | 219/275 |
| 5,188,863 | 2/1993 | De Graaf et al. | 427/512 |
| 5,215,789 | 6/1993 | Kugan | 427/561 |

FOREIGN PATENT DOCUMENTS

| | | |
|---|---|---|
| 0 055 344 | 7/1982 | European Pat. Off. . |
| 0 289 195 | 11/1988 | European Pat. Off. . |
| 2821131 | 11/1979 | Germany . |
| WO 86/02387 | 4/1986 | WIPO . |

OTHER PUBLICATIONS

Powell et al., "Vapor Deposition", The Electrochemical Society, Inc., pp. 241, 584 and 585, Jan. 1966.

*Primary Examiner*—Brian K. Talbot
*Attorney, Agent, or Firm*—Burns, Doane Swecker & Mathis LLP

[57] ABSTRACT

The invention relates to a method of piece by piece metal coating of thermally sensitive objects, for example optical discs. The objects are coated by being located particularly close to an evaporation source for evaporated metal. The evaporation source constitutes a melt enclosed in a crucible which is heated by inductive means. The distance between the object and the melt is kept to a few centimeters and the exposure time is kept to a few seconds in order to coat the objects without causing damage. The method includes the steps of providing an evaporation chamber containing an evaporation source of metal, reducing the pressure in the evaporation chamber, and placing the object in the evaporation chamber so that a surface of the object is opposed to a surface of the source of metal and is separated from the surface of the source of metal by a distance which is the same as or less than a dimension of the surface of the object to be coated.

28 Claims, 1 Drawing Sheet

METHOD FOR METAL COATING DISCRETE OBJECTS BY VAPOR DEPOSITION

This application is a continuation of application Ser. No. 08/094,098, filed as PCT/SE92/00070, Feb. 6, 1992 published as WO92/13980, Aug. 20, 1992 now abandoned.

This invention is related to vapour deposition of metal particularily on discrete separate objects. Vapor deposition of discrete objects today exercised industrially in such a way that in a large closed space or room the objects that are to be coated with metal are positioned in a fixture along the walls of the room and centrally in this a number of vapour sources are placed, constituted by a great number of small Wolfram filaments. These are each loaded with a short piece of aluminium wire and are then heated to a very high temperature by a large electric current through the Wolfram filaments. At this the aluminium is first vapourized and then deposited on the objects that are to be coated. Prior to the vapourizing process the room has been evacuated. By using several vapour sources and by moving and/or rotating the objects in different ways it is possible to obtain a comparatively even coating of the objects.

This is a comparatively time consuming process since some time is necessary for the vapour source to deliver a sufficient amount of metal to obtain the desired coating thickness on the subjected objects. All metal vapour will not be deposited on the intended objects, but instead on the walls of the room and on the fixture. With time the deposits on walls and fixture will become so great that metal flakes easily result when for instance air once again is released into the large evaporation room. Such metal flakes, even if they have a size that is smaller than in the air freely suspended small dust particles, can be an absolute and immediate reason for rejection of very sensitive objects, even if the disturbance is almost impossible to detect, even with the aid of a magnifying glass. An example of such sensitive objects are compact discs for data storage or corresponding discs for the storage of picture images "video discs".

Also the need to evacuate and refill air into the evaporation room result in additional time losses. Also the positioning of the objects that are to be coated is very time- and/or resource demanding. It is furthermore necessary to calculate and test very carefully the time for which the objects must be subjected to the emitted vapours in order to obtain the correct and even deposit that is desired. It is furthermore often difficult to secure an even and conform coating for succeessive objects. A possible malfunction in the industrial batch coating of entire loads of objects will result in a great number of objects that have to be discarded.

To sum up it can be stated that even if the evaporation technique as such result in a good result, is it today too timeconsuming and circumstancial to enable use for rapidly massproduced articles, as for instance compact discs, where instead cathode disintegration or sputtering is used. This technique however limits the choice of material in the discs or objects that are to be coated to thermally comparatively insensitive materials that are also regretfully therefor materials that are difficult to shape, as for instance poly-carbonate (PC). This in turn limits the disc size due to the shaping problems at larger discs as for instance video discs. It is quite simply difficult satisfactorily to correctly fill out the entire matrix at the edges of the disc. As a result of these difficulties and the resulting large discard percentage the video discs have not yet reached any larger market.

In view of the above problems the invention has as its object to provide a method for metal coating that is quick and efficient, and that requires a minimum of space and machine equipment for use and that can be used also on thermally sensitive and very easily shaped materials and that allows high rate coating of separate discrete objects piece by piece and in cooperation with for instance presure moulding machines.

The above object has in accordance with the invention a surprisingly simple solution, that however is completely controversal to the conventional teachings of evaporation, in particular in view of its appliability for sensitive materials and shapes. In accordance with the invention the metal vapour source and the object to be coated are namely placed very close (a few centimeters) to each other. The evaporation or metal emission rate from a vapour source is dependent of the temperature and a high temperature is necessary in order to obtain any noticeable evaporation. It is therefore unlikely in view of the known technique that plastics and then in particular heat sensitive plastics, with for instance micro structures, could be coated in this way since they have a comparatively low melting point and since the heat load increase with the temperature and the reduction in distance. In particular in the coating of so called compact discs and the like where very fine micro structures must be retained, it would according to the known technique be impossible to locate the vapour source so close to the object that it is to be coated without the disc being damaged.

The improbability of the inventive thought or teaching is however only an illusion since it in practice been established that despite a high temperature of the evaporation source and a very short distance between this and the object for instance compact discs can be coated with a high quality metal coating without influencing the micro structure of the coated surface.

Preferably and contrary to the prior art the evaporation source is made large, that is to say with a surface that more or less corresponds to that of the compact disc. The large surface will provide a long life for the evaporation source and a very even high quality coating of for instance compact discs.

The evaporation source will of course radiate heat that in turn heats the object that is to be metal coated. It has however been found that with the inventive method the metal coating of the object that is to be coated can be obtained very rapidly (only a few seconds) and while the coating is done the temperature increase remains at a moderate value, in practice measured to about 30 degrees (Celcius). The reason for this is probably not only that the exposure time can be kept short, but when researching for probable explanations as to why the inventive method is possible at all we believe it to be the fact that when an evaporation source as for instance molten aluminium is well molten a mirror-like melt surface is obtained. The metal surface is like a mirror which in turn means that it will become a bad heat radiator. The mirror-like surface of the melt has only a few percent of the heat radiation that would result otherwise. Due to this the metal evaporation will be more efficient and faster than the heat radiation. When additionally successively the surface to be coated becomes coated even this will become reflecting and reflect the heat radiation. In the case of aluminium the low specific emission factor of the heat radiation also contributes.

By using a large surface for the evaporation melt in practice the temperature of this melt can be permitted to be lower than what otherwise would be the case in order to obtain sufficient evaporation rate. This also diminish the heat load of the object that is to be coated.

The above method will provide a very efficient coating. Since object and source are very close very little metal vapours will pass the object. In order to adapt the method to a pressure moulding line each coating including transports may take a few seconds. Preferably the movements of the objects are fast and for the major part of the coating cycle the object is kept still in the coating position. In this way the movements will cause no impairing of the evenness of the coating and furthermore very little metal vapours will have time to pass the location of the object to be coated. These features in combination with what has been said above does actually allow a lower temperature than expected. The fact is that even if the coating, as carried out today, in accordance with the invention, seems extremely fast, it has actually been slowed down from its possible rate to adapt to the other machines in the fabrication line.

By means of the invented method it is possible to metal coat compact discs and the like fabricated of polymethyl methacrylate PMMA (Plexiglass$^R$) or other plastics with a low melting point since the heat load is so small that the surface structure do not risk being softened or destroyed. Until now it has been necessary to use polycarbonate PC that is less sensitive. This material is however in itself not suited to rapid forming of large objects (i.e. video discs) and the invention therefor allows a very great gain from a practical point of view since it allows the use of more easily shapeable PMMA plastics. These are furthermore less sensitive to scratches, which is also of interest for optical discs as compact discs, video discs, CD roms etc.

Not unessential is also that PMMA is obviously less expensive than PC and has better optical properties than PC. The latter is particularily important when the stored information is stored in an analogous way as for instance pictures on video discs but less important for sound discs with a digital storing of the information, why it is possible to use sputtering and PC for these discs.

An undirect effect of the method according to the invention with a short distance between the evaporation source and the object to be coated is that the target accuracy of the evaporated metal will be great and the waste small, that is to say a very good use will be made of the metal.

In accordance with the inventive thought it is thus possible to allow even comparatively thin plastic objects with a corresponding low heat storage capacity for a short time to be exposed to metal vapour very close to the metal melt emitting the vapour. The distance can actually be allowed to be only a few centimeters with a vapour source that has a surface that is as large as the surface of the object that is to be coated or even greater.

In a preferable further development of the inventive method a steady and good coating can be obtained from object to object by measuring the thickness of the coating. This can for instance be made by using a photo transistor that via a mirror measures the heat or light emission passing from the metal melt through a plastic object to be coated and out on its rear or unexposed side. With the use of a mirror the photo transistor is protected from the metal vapour and the mirror will continue to work as a mirror even if it becomes metal coated. Although its reflection properties will change with time this is no problem since a relative measuring is sufficient to check and control the process. Alternatively the heat/light radiation reflected against the object that is to be coated can be measured but this will in all probability result in a lesser measuring accuracy and is difficult to arrange.

Due to the very short exposure time it is possible to execute the invented method as a part step in a greater fabrication process, where in order to secure vacuum in the metal coating chamber this can be provided with vacuum gates or locks on entrance and exit sides. The execution of the method is faciliated also by the fact that the vacuum chamber can be small and thus rapidly can be evacuated.

Further advantages and features of the invention are apparent from the following description of a preferred embodiment shown on the enclosed drawings.

DETAILED DESCRIPTION OF THE PREFERRED EMBODIMENT

Figure 1:
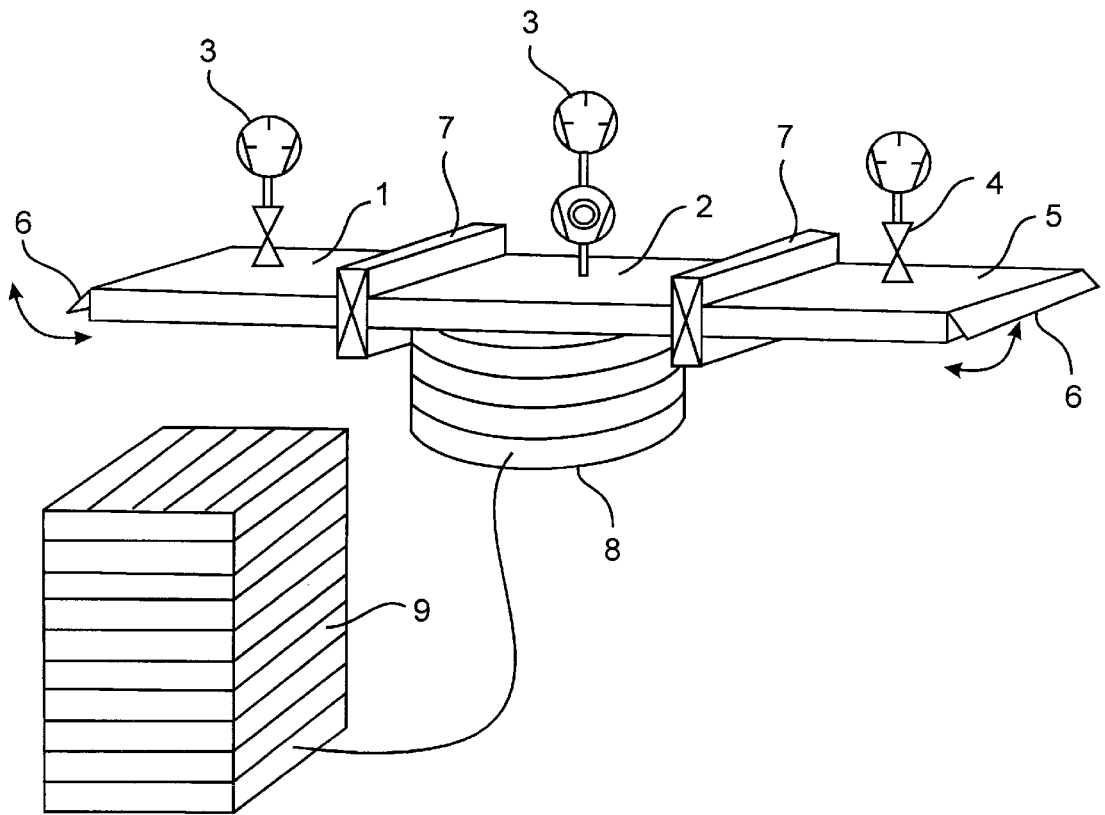
FIG. 1 is a schematic, isometric view of a device for metal coating of compact discs according to the invention.

The metal coating device shown in FIG. 1 includes a first gate chamber 1, an evaporation room 2 and a second gate chamber 5. To each of the chambers 1, 2 and 5 is connected a vacuum pump 3 via a valve 4. The gate chambers 1 and 5 are in their outer ends provided with tightly closeable lids 6 and between the gate chambers 1 and 5 and the metal coating chamber 2 respectively valves or locks or gate doors 7 are arranged.

Figure 2:
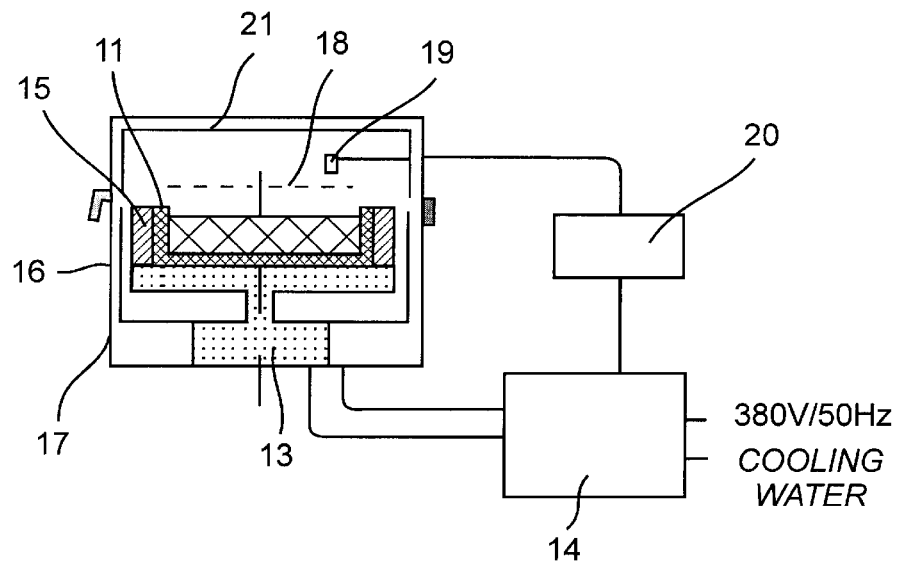
FIG. 2 is a schematic, side view of the evaporation source for metal in accordance with the invention.

The coating chamber 2 is at its bottom provided with an evaporation unit for aluminium in accordance with FIG. 2. This unit has been designated 8 and is connected to a driving and controling unit 9. At the use of the device this works in such a manner that at first a compact disc is inserted into the left gate chamber 1. The lid 6 is closed and the air evacuated by means of the vacuum pump 3. Then the valve or gate port 7 is opened and the compact disc is brought into the coating chamber 2 above the evaporation source for aluminium. The compact disc then remains in the coating chamber the short time necessary to obtain a proper coating. Thereafter the compact disc is returned to the gate chamber 1, the valve 7 is closed and the compact disc is removed via the lid 6 of the chamber 1. The chamber 5 is loaded in the same way as the chamber 1 with compact discs and in the coating chamber 2 alternative discs from the gate chamber 1 and the gate chamber 2 respectively are coated, the valves or gate ports 7 being closed against the chamber that is loaded meanwhile.

Since discs are fed alternatively from right and left a high production rate is obtained with a calm and secure handling of the discs.

Of course, a device of the above described type can also be adapted for objects that are to be coated that all the time pass in one and the same direction in steps. Since the example refers to compact discs, for instance from PMMA or PC the different chambers have a flat look. If other objects, as for instance headlight reflectors or the like are to be coated the shape must of course be different. The pumps 3 that are connected to the gate chambers 1 and 5 can preferably be rotating two /stage vane pumps while the pump that is connected to the coating chamber preferably is turbo molecular pump.

The evaporation source of aluminium shown in FIG. 2 includes a crucible 11 with molten aluminium 12. The crucible rests on an induction heating device, a coil 13, which also is water-cooled. The coil 13 is fed with current and cooling from the driving unit 14. Around the crucible this is surrounded by heat insulation 15 and outside this a cooling shield 16, which also extends below the major part of the crucible and into the induction heat means. Finally crucible and induction heat means are surrounded by a vacuum enclosure 17. Above the melt of aluminium a compact disc 18 has been depicted in dashed lines when being coated with aluminium. When coating takes place the light/heat radiation that can be detected by the detector 19, consituted by a photo transistor is diminished. This reduction can be detected by a control unit 20 that in turn controls the drive unit for the induction heat means so that a stable coating rate is obtained for the heating means. Furthermore the control unit 20 controls the feeding of the compact discs 18. This is done in such a way that when the detector 19 has noted a sufficient lowering of the radiation in relation to the radiation level obtained when no disc is on place the disc is sufficiently coated and removed. In this way the feeding rate can be adapted to the coating rate and a continuous and sufficient but not exaggerated coating is obtained for the discs. Alternatively time can be kept more or less constant (which faciliates the connection to the other production steps) and instead the coating rate is influenced by controlling the temperature of the melt based on the thickness of the coating as measured by the photo transistor.

Also above the crucible and the aluminium melt a shield 21 is arranged. This partly acts as a cooling shield partly as a collector for aluminium vapours that have not adhered to the intended objects. In this way it is simple to keep the coating chamber clean from metal deposits that otherwise would contaminate by changing the shield 21.

Since the coating is done from below on the compact discs the risk of enclosing dust and the like is diminished since the dust prefer falling down to falling up.

With the described device it is estimated that 120,000 compact discs can be coated within a time of about 100 hours. The time for coating one compact discs properly can be approximated to about 3 seconds.

It goes without saying that the vapour source according to the invention has a considerable improved length of life as compared to the Wolfram filaments according to the known technique and that the method according to the invention and its evaporation source is far better adapted for industrial use than the prior art is. The vapour source according to the invention as it has been described above does however not require continuous use but can be switched on and off comparatively quickly. This can be done by lowering the temperature of the melt. Through a moderate lowering the evaporation rate is namely reduced and the aluminium will remain in the melt. When evaporation once again is to take place the temperature is once again raised to working temperature. The establishment of these temperature variations is far quicker than if one would have to shut down the device totally. Since the melt is enclosed in vacuum it can be kept heated and fluid for comparatively long time (three weeks!) at a low evaporation rate.

The starting time from normal room temperature can be estimated about twenty minutes, while a change from work temperature to a lower stand by temperature is in the size of three minutes and a return to working temperature can then be obtained in about ten minutes. At these decreases and increases respectively of the temperature between the working temperature and stand-by temperature aluminium evaporated during this time can be collected by a particular shield intended for this.

Even if, as has been said above, the evaporation and the coating takes place in an evacuated surrounding it is no catastrophy if some air should happen to enter into the evaporation source for instance in connection with service or due to lacking tightness. At the prior art now used evaporation sources with Wolfram filaments etc. one can count on a practically complete destruction of the evaporation sources if air should enter, in other words the increase in production security is large.

To sum up, the invention enables fast continuous piece by piece metal coating of discrete objects and surfaces with a good and durable adhering and even coating on very sensitive objects of for instance plastics with a low melt and shaping temperature, with a device that in comparison to the known technique is small and simple and has a good production security and an essentially reduced risk for rejected objects.

Of course the inventive thought can also be used for the metal coating of less sensitive materials and/or objects.

I claim:

1. A method of coating an object having a first surface to be coated comprising:

providing an evaporation chamber containing an evaporation source of metal having a first surface;

creating a vacuum in the evaporation chamber;

coating the object by placing the object in the evaporation chamber so that the first surface of the object is opposed to the first surface of the source of metal and is separated from the first surface of the source of metal by a distance which is the same as or less than a largest diameter of the first surface of the object to be coated and evaporating metal from the evaporating source onto the object by supplying heat to the evaporating source to substantially uniformly heat the source; and maintaining the object stationary for a selected period during the coating step;

wherein the first surface of the evaporation source has an emitting area essentially at least corresponding in size to an area of the first surface of the object to be coated.

2. The method according to claim 1, wherein the object to be coated is a compact disc.

3. The method according to claim 1, wherein the object to be coated is made of polymethyl methacrylate.

4. The method according to claim 1, wherein the first surface of the evaporation source has an emitting area essentially corresponding in shape to an area of the first surface of the object to be coated.

5. The method according to claim 1, further comprising a step of measuring a thickness of the coating during the coating step by measuring a heat or light intensity from the evaporation source of metal.

6. The method according to claim 5, wherein the thickness of the coating is measured by a detector which detects the amount of heat or light which passes through the object.

7. The method according to claim 1, wherein the object is a disc.

8. The method according to claim 1, wherein the selected period is about three seconds.

9. The method of claim 1, wherein the heat is supplied by heat induction.

10. The method of claim 1, wherein the object has a discrete shape.

11. The method of claim 10, wherein the metal is aluminum or an aluminum alloy.

12. The method of claim 1, wherein the object is a plastic disc.

13. The method of claim 12, wherein the disc is circular.

14. A method for metal coating objects having first surfaces to be coated comprising:

providing an evaporation chamber containing an evaporation source of aluminum or aluminum alloy having a first surface;

creating a vacuum in the evaporation chamber;

coating an object made of polymethyl methacrylate by placing the object to be coated in the evaporation chamber so that the first surface of the object is opposed to the first surface of the source of metal and is separated from the first surface of the source of metal by a distance which is the same as or less than a largest diameter of the first surface of the object to be coated, evaporating the aluminium or aluminum alloy from the evaporation source onto the object by supplying heat of the evaporation source to substantially uniformly heat the source, and maintaining the object stationary for about three seconds until the object is coated; and repeating the coating step for additional objects;

wherein the first surface of the source of metal has an emitting area essentially at least corresponding in size to an area of the first surface of the object to be coated.

15. The method of claim 14, wherein the heat is supplied by heat induction.

16. The method of claim 14, wherein the object is a circular disc.

17. The method of claim 14, wherein the object has a discrete shape.

18. A method for metal coating an object having a first surface comprising:

providing an evaporation chamber containing an evaporation source of metal having a first surface;

creating a vacuum in the evaporation chamber;

coating the object by placing the object to be coated by metal in the evaporation chamber so that the first surface of the object is opposed to the first surface of the evaporation source and is separated from the first surface of the source of metal by a distance which is the same as or less than a largest diameter of the first surface of the object to be coated, wherein the first surface of the object to be coated has a size and shape corresponding to a size and shape of the first surface of the evaporation source, and by evaporating metal from the evaporation source onto the object by supplying heat to the evaporation source to substantially uniformly heat the source.

19. The method of claim 18, wherein the heat is supplied by heat induction.

20. The method according to claim 18, wherein the object to be coated is placed in the evaporation chamber so that the first surface of the object and the first surface of the source of metal are parallel.

21. The method according to claim 18, wherein the object is maintained in the evaporation chamber for about three seconds.

22. The method according to claim 18, wherein the object placed in the evaporation chamber is removed when a temperature of the object has increased about 30° C.

23. The method according to claim 18, wherein the object is first placed in a vacuum chamber and then enters the evaporation chamber from the vacuum chamber through a gate.

24. The method according to claim 22, wherein two vacuum chambers and two gates are provided and a plurality of objects enter the evaporation chamber from either of the two vacuum chambers through either of the two gates.

25. The method of claim 18, wherein the object is a plastic disc.

26. The method of claim 25, wherein the metal is aluminum or an aluminum alloy.

27. The method of claim 26, wherein the disc is circular.

28. The method of claim 18, wherein the object has a discrete shape.

* * * * *